(12) United States Patent
Wu et al.

(10) Patent No.: US 10,361,701 B2
(45) Date of Patent: Jul. 23, 2019

(54) OPERATIONAL AMPLIFIER, DRIVING INTERFACE, MEASUREMENT AND CONTROL DEVICE, DRIVING CIRCUIT AND DRIVER

(71) Applicant: LIUZHOU GUITONG TECHNOLOGY CO., LTD., Guangxi (CN)

(72) Inventors: Jin Wu, Guangxi (CN); Baokun Wu, Guangxi (CN); Zhenghai Kang, Guangxi (CN)

(73) Assignee: LIUZHOU GUITONG TECHNOLOGY CO., LTD., Guangxi (CN)

( * ) Notice: Subject to any disclaimer, the term of this patent is extended or adjusted under 35 U.S.C. 154(b) by 0 days.

(21) Appl. No.: 15/562,424

(22) PCT Filed: Apr. 20, 2016

(86) PCT No.: PCT/CN2016/079734
§ 371 (c)(1),
(2) Date: Sep. 28, 2017

(87) PCT Pub. No.: WO2017/113550
PCT Pub. Date: Jul. 6, 2017

(65) Prior Publication Data
US 2018/0294811 A1 Oct. 11, 2018

(30) Foreign Application Priority Data

Dec. 29, 2015 (CN) .......................... 2015 1 1018182

(51) Int. Cl.
*G09G 5/00* (2006.01)
*H03K 19/018* (2006.01)
(Continued)

(52) U.S. Cl.
CPC ......... *H03K 19/01812* (2013.01); *G01R 1/30* (2013.01); *G01R 31/3277* (2013.01);
(Continued)

(58) Field of Classification Search
CPC .................... H03F 3/45; H03F 3/4508; H03F 2203/45151; H03F 2203/45158; H03F 2203/45202; H03K 19/0175
See application file for complete search history.

(56) References Cited

U.S. PATENT DOCUMENTS 3,729,685 A * 4/1973 Linder .................... H03F 1/083
327/493
5,831,454 A 11/1998 Keating
(Continued)

FOREIGN PATENT DOCUMENTS

| CN | 202870277 U | 4/2013 |
|----|-------------|--------|
| CN | 105099381 A | 11/2015 |
| CN | 205453661 U | 8/2016 |

OTHER PUBLICATIONS

Translation of Chinese Pub. No. CN202870277 U, 8 pages.*

*Primary Examiner* — Joe H Cheng
(74) *Attorney, Agent, or Firm* — Gang Yu (57) ABSTRACT

An operational amplifier, a driving interface, a measurement and control device, a driving circuit and a driver are provided. The operational amplifier is used as at least one of an input interface and output interface, and when the operational amplifier corresponds to one transistor (Q), an external circuit of the transistor further includes: a first port (Vdj), connected with a base (B) of the transistor (Q) through a first resistor (Rb); a second port (I/Oe), connected with an emitter E of the transistor (Q); a third port (I/Oc), connected with a collector (C) of the transistor (Q); and a fourth port (GND), connected with the emitter (E) of the transistor (Q) through (Continued)

a second resistor and used as a public port for signal input and signal output.

2 Claims, 5 Drawing Sheets

(51) Int. Cl.
*H03K 19/0175* (2006.01)
*G01R 1/30* (2006.01)
*G01R 31/327* (2006.01)
*G09G 3/32* (2016.01)
*H03F 3/45* (2006.01)
*H05B 33/08* (2006.01)

(52) U.S. Cl.
CPC ............ *G09G 3/32* (2013.01); *H03F 3/4508* (2013.01); *H03F 3/45085* (2013.01); *H03K 19/0175* (2013.01); *H05B 33/0809* (2013.01); *G01R 31/3278* (2013.01); *G09G 2310/0291* (2013.01); *G09G 2330/02* (2013.01); *H03F 2203/45151* (2013.01); *H03F 2203/45392* (2013.01); *H03F 2203/45481* (2013.01)

(56) References Cited

U.S. PATENT DOCUMENTS

| | | | | |
|---|---|---|---|---|
| 5,977,755 A * | 11/1999 | Miki | ....................... | G05F 1/577 323/269 |
| 6,081,139 A | 6/2000 | Liepold et al. | | |
| 7,233,136 B2 * | 6/2007 | Makino | ..................... | G05F 3/30 323/313 |
| 7,675,353 B1 * | 3/2010 | MacK | ....................... | G05F 3/30 327/539 |
| 2011/0309759 A1 * | 12/2011 | Shteynberg | ........ | H05B 33/0815 315/201 |
| 2013/0320960 A1 * | 12/2013 | Fosas | ................. | G01R 19/0092 324/120 |
| 2014/0015509 A1 * | 1/2014 | Gupta | ....................... | G05F 3/30 323/313 |
| 2015/0076910 A1 * | 3/2015 | Wang | ................... | H02M 3/156 307/52 |

* cited by examiner

OPERATIONAL AMPLIFIER, DRIVING INTERFACE, MEASUREMENT AND CONTROL DEVICE, DRIVING CIRCUIT AND DRIVER

This is the U.S. National Stage of International Patent Application No. PCT/CN2016/079734 filed Sep. 28, 2016, which in turn claims the benefit of Chinese Patent Application No. 201511018182.6 filed Dec. 29, 2015.

TECHNICAL FIELD

The present disclosure relates to the technical field of electronics, and in particular to an operational amplifier, a driving interface, a measurement and control device, a driving circuit and a driver.

BACKGROUND

In a field of electronic measurement and control involved in a working process of an electronic, electrical or intelligent product, whether a bidirectional interface device in and outside an existing Central Processing Unit (CPU) or Micro Control Unit (MCU) is used for inputting or outputting when being practically operated is determined by a direction selection circuit through an outgoing control line, and a practical direction and applicability of a level conversion circuit during application are determined during manufacturing and production. For example, a Darlington driving device ULN2003 is used for outputting driving; a bus driver 74HC245 is required to be determined by a direction pin when being operated; various data selectors are used for inputting selection; various data allocators are used for outputting allocation; a photocoupler cannot be used for inputting if being designed for outputting in a practical application circuit, and on the contrary, cannot be used for outputting if being designed for inputting; and a Light-Emitting Diode (LED) driver has a constant current driving function.

An interface circuit or level conversion circuit in the related art has the following defects.

One, for a unidirectional interface circuit, after an application circuit is designed or manufactured, an input or output direction of the application circuit is determined, and it is very difficult to change the input or output direction during a practical application.

Two, for a bidirectional interface circuit, after an application circuit is designed or manufactured, an adapted port voltage or current range of the application circuit is determined, and it is very difficult to apply the application circuit to an environment with high-voltage input or a high-current driving requirement during a practical application.

Three, undiversified application of a signal acquisition or output driving circuit board card applied to a field of measurement and control is determined in a design process, and is unlikely to be changed during a practical application, and no corresponding board card is allowed to be added regardless of lack of a path of input or output and sufficient redundancy of board cards applied to the other direction, so that a circuit structure is complex, and cost is increased.

Four, when a measurement and control product is researched and developed, there always exist problems of lack of either input or output and the like when a manufactured board card is debugged on the spot, unless there is sufficient redundancy left regardless of cost, and at this moment, if modification of a hardware design and remanufacturing are required, a research and development period is obviously prolonged.

Five, after a board card product is shaped, if software function upgrading is required, there usually exists a problem of lack of an input or output port.

Six, on the same application board card, a corresponding input or output interface chip is usually required to be selected according to a measurement and control object, which further causes increase of research and development cost or inventory management cost of a production element.

Seven, a withstanding voltage value of an input port of an MCU or a CPU is limited not to be twice higher than a working voltage of an interface circuit or a level conversion circuit, which seriously influences an application range of the MCU or the CPU.

For a problem of application circuit performance reduction caused by an incapability of an interface circuit or a level conversion circuit in supporting conversion of an input or output interface in the related art, no effective solution has been provided yet.

SUMMARY

At least some embodiments of present disclosure provide an operational amplifier, a driving interface, a measurement and control device, a driving circuit and a driver, so as at least to partially solve a technical problem of application circuit performance reduction caused by an incapability of an interface circuit or a level conversion circuit in supporting conversion of a high-voltage input interface and a high-current output interface in the related art.

In one embodiment of the present disclosure, an operational amplifier is provided, which is used as at least one of an input interface and output interface, and when the operational amplifier corresponds to one transistor, an external circuit of the transistor further includes: a first port, connected with a base of the transistor through a first resistor; a second port, connected with an emitter of the transistor; a third port, connected with a collector of the transistor; and a fourth port, connected with the emitter of the transistor through a second resistor and used as a public port for signal input and signal output.

In one embodiment, the operational amplifier further includes: a first diode, connected in series with the first resistor, and an anode of the first diode is connected with the first resistor and a cathode of the first diode is connected with the base of the transistor, or an anode of the first diode is connected with the first port and the cathode of the first diode is connected with the first resistor.

In one embodiment, the operational amplifier further includes: a second diode, of which an anode is connected with the emitter of the transistor and a cathode is connected with the third port.

In another embodiment of the present disclosure, a driving interface which is a current or voltage driving interface, is further provided, and the driving interface includes abovementioned operational amplifier, and a first port and fourth port of the operational amplifier are suspended, and a driving current or a driving voltage flows into a second port of the operational amplifier, and flows out of a third port of the operational amplifier through a second diode of the operational amplifier, and the third port of the operational amplifier is connected with a driven object.

In another embodiment of the present disclosure, a measurement and control device is further provided, which includes at least one measurement and control interface, and the measurement and control interface is above-mentioned operational amplifier.

In another embodiment of the present disclosure, a driving circuit, which is arranged to drive an LED, is further provided, and the driving circuit includes above-mentioned operational amplifier, and the driving circuit further includes: a first resistance voltage divider, of which an adjustable end is connected with a first port of the operational amplifier and the other end of the operational amplifier is connected with a power supply, and an anode end of a driven LED is connected with the power supply or a power supply common-grounded with a fourth port, and the other end is connected with a third port in the operational amplifier; and a second resistance voltage divider, of which an adjustable end is connected with a second port of the operational amplifier and the other end is grounded.

In another embodiment of the present disclosure, a driver, which is arranged to drive an electronic graph-text display screen, is further provided, and the electronic graph-text display screen includes at least one driving signal input interface, and the driver includes: a driving circuit, connected with the at least one driving signal input interface, and the driving circuit includes at least one above-mentioned operational amplifier; a control element, connected with the driving circuit and arranged to control a driving process of the driving circuit over the electronic graph-text display screen; and a power supply, connected with the driving circuit and the control element respectively.

In one embodiment, the driving circuit includes: a power port, connected with the power supply, and the power port is a common port of a first port of the at least one operational amplifier, and a current in-phase input port or voltage inverted input port of the operational amplifier corresponds to a base port of one transistor; at least one emitter port, connected with the control element respectively, and a current inverted input port or voltage in-phase input port of each operational amplifier corresponds to an emitter port of one transistor; at least one collector port, connected with the at least one driving signal input interface, and an output port of each operational amplifier corresponds to one collector port; and a grounding port, which is a common port of a fourth port of the at least one operational amplifier.

In another embodiment of the present disclosure, a detection device, which is arranged to detect an on/off state of a switch, is further provided, and the detection device includes above-mentioned operational amplifier, and a third port of the operational amplifier is used as a signal input port and the detection device further includes: the switch used as a detected object, of which one end is connected with a collector of a transistor of the operational amplifier through the signal input port and the other end is grounded; and a current limiting resistor, arranged to convert the on/off state of the switch into a low/high state of a level signal, and the third port of the operational amplifier is connected with a power supply of the detection device or a power supply common-grounded with a fourth port through the current limiting resistor.

In another embodiment of the present disclosure, a sensor, which is applied to detection of a signal level state in a wide voltage fluctuation range, is further provided and the sensor includes above-mentioned operational amplifier, and a detected signal source is connected with a third port, a detection signal is output from a second port, and a magnitude of a current shunted from the detected signal source for a transistor is controlled by adjusting a second resistor or a first resistor.

In the embodiments of the present disclosure, the operational amplifier is used as at least one of an input interface and output interface. When the operational amplifier corresponds to one transistor, the external circuit of the transistor further includes: the transistor; the first port, connected with the base of the transistor through the first resistor; the second port, connected with the emitter of the transistor; the third port, connected with the collector of the transistor; and the fourth port, connected with the emitter of the transistor through the second resistor and used as the common port for signal input and signal output. The operational amplifier of the embodiments of the present disclosure implements flexible conversion between an input interface and an output interface, thereby achieving technical effects of widening an application range of the operational amplifier and improving overall performance of an application circuit and further solving the technical problem of application circuit performance reduction caused by an incapability of an interface circuit or a level conversion circuit in supporting conversion of the input or output interface in the related art.

DETAILED DESCRIPTION

In order to make solutions of embodiments of the present disclosure better understood by those skilled in the art, the technical solutions in the embodiments of the present disclosure will be clearly and completely described below in combination with the drawings in the embodiments of the present disclosure. Obviously, the described embodiments are not all embodiments but only part of embodiments of the present disclosure. All other embodiments obtained by those skilled in the art on the basis of the embodiments in the present disclosure without creative work shall fall within the scope of protection of the embodiments of the present disclosure.

It is important to note that terms "first", "second"and the like in the specification, claims and drawings of the embodiments of the present disclosure are adopted not to describe a specific sequence or order but to distinguish similar objects. It should be understood that data used like this can be exchanged under a proper condition for implementation of the embodiments of the present disclosure described here in a sequence except those shown or described herein. In addition, terms "include" and "have" and any transformation thereof are intended to cover nonexclusive inclusions. For example, a process, system, product or device including a series of elements is not limited to those elements which are clearly listed, but includes other elements which are not clearly listed or intrinsic to the process, the product or the device.

According to an embodiment of the present disclosure, an embodiment of an operational amplifier is provided. It is important to note that the operational amplifier of the embodiment is used as an input interface of an application circuit, is also used as an output interface of the application circuit, and is further simultaneously used as the input and output interfaces of the application circuit.

Figure 1:
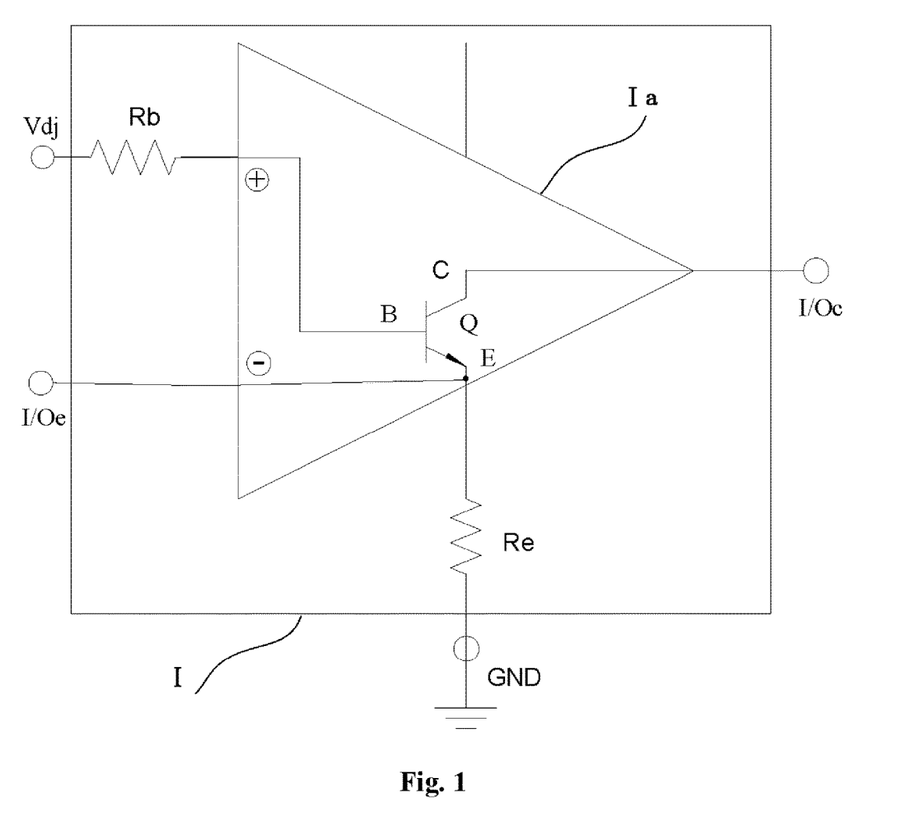
FIG. 1 is a structural schematic diagram of an operational amplifier according to an embodiment of the present disclosure.

FIG. 1 is a structural schematic diagram of an operational amplifier according to an embodiment of the present disclosure. As shown in FIG. 1, the operational amplifier includes: a transistor Q; a first port Vdj, connected with a base B of the transistor Q through a first resistor Rb; a second port I/Oe, connected with an emitter E of the transistor Q; a third port I/Oc, connected with a collector C of the transistor Q; and a fourth port GND, connected with the emitter E of the transistor Q through a second resistor Re and used as a public port for signal input and signal output.

The first port Vdj is used as a control voltage input port regulating a magnitude value of a current absorbed from the port I/Oc. The second port I/Oe is used as a port for level output of a level state value of a sampling point directly connected with the third port I/Oc and target driving high current input. The third port I/Oc is used as a port connected with the sampling point with a wide voltage fluctuation range and configured for constant current input and target driving high current output. The fourth port GND is used as a public port configured for signal input and output and connected with a cathode of a working power supply.

As shown in FIG. 1, there are included totally three components in a box I, and their connecting relationship is as follows.

Q is the transistor, also called as a transistor triode and also habitually called by part of people as a triode, and represents an open collector output current operational amplifier Ia. And B is the base of the triode Q, is an in-phase input end for the represented open collector output current operational amplifier Ia, and is connected to the port Vdj through the resistor Rb. A magnitude of a current flowing through Rb simultaneously determines a magnitude of a current flowing into the port I/Oc. E is the emitter of the triode Q, is an inverted input end for the represented open collector output current operational amplifier Ia, is directly connected to the port I/Oe, and is also connected to the port through the resistor Re. When a voltage applied to Vdj is constant, the current flowing into the port I/Oc is lower if resistance of the resistor Re is higher. C is the collector of the triode Q, is an output end for the represented open collector output current operational amplifier Ia, is directly connected to the port I/Oc, and is also a sampling current sinking port.

It is important to note that the triode Q in the embodiment of the present disclosure is a bipolar ordinary transistor triode, adopts a Negative-Positive-Negative (NPN) type structure, like the triode Q shown in FIG. 1, and also adopts a Positive-Negative-Positive (PNP) type triode or a monopolar Complementary Metal Oxide Semiconductor (CMOS) triode. The operational amplifier in the embodiment of the present disclosure is also a current amplifier of another form, to form a circuit with a similar function.

Figure 2:
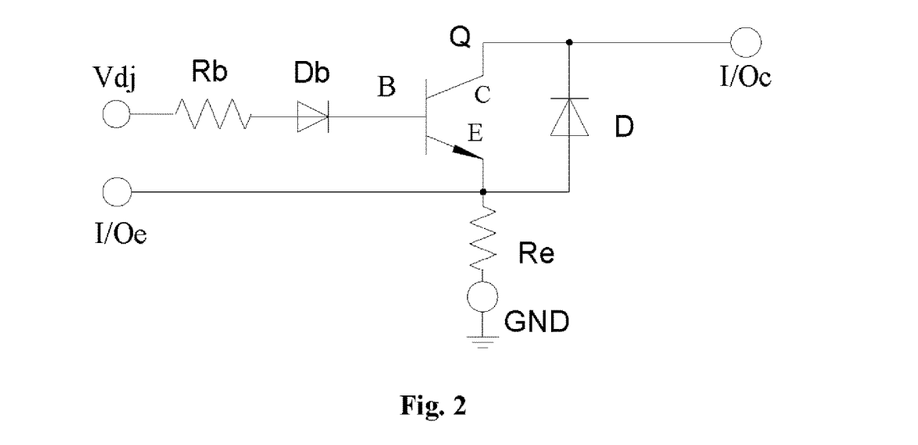
FIG. 2 is a structural schematic diagram of an operational amplifier according to one exemplary embodiment of the present disclosure.
Figure 3:
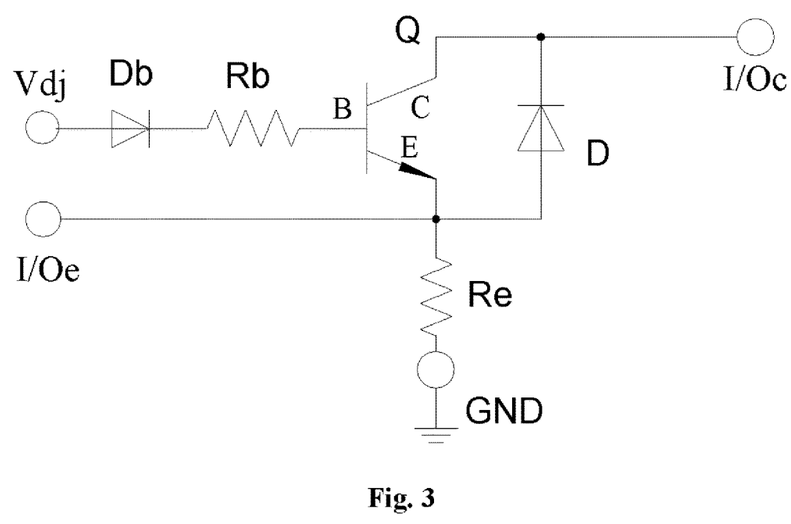
FIG. 3 is a structural schematic diagram of an operational amplifier according to another exemplary embodiment of the present disclosure.

As an optional embodiment, FIG. 2 is a structural schematic diagram of an operational amplifier according to an embodiment of the present disclosure, and FIG. 3 is a structural schematic diagram of an operational amplifier according to an exemplary embodiment of the present disclosure. As shown in FIG. 2 and FIG. 3, the operational amplifier of the embodiment further includes: a first diode Db, connected in series with the first resistor Rb, and an anode of the first diode Db is connected with the first resistor Rb and a cathode is connected with the base B of the transistor Q. Or the anode of the first diode Db is connected with the first port Vdj and the cathode is connected with the first resistor Rb. According to the operational amplifier of the embodiment of the present disclosure, the diode Db is connected in series between the base B of the transistor Q and the first port Vdj, so that an effect of enlarging a value of a driving voltage allowed to be output to the third port through the second port is achieved.

Figure 4:
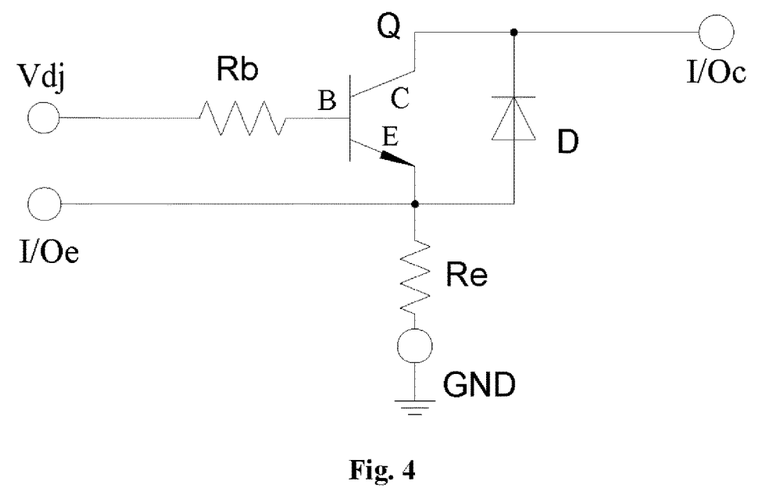
FIG. 4 is a structural schematic diagram of an operational amplifier according to another exemplary embodiment of the present disclosure.

As an optional embodiment, FIG. 4 is a structural schematic diagram of an operational amplifier according to another exemplary embodiment of the present disclosure. As shown in FIG. 4, the operational amplifier of the embodiment further includes: a second diode D, of which an anode is connected with the emitter E of the transistor Q and a cathode is connected with the third port I/Oc. The port I/Oc is connected to E and the port I/Oe through the second diode D. D is a path through which a driving current enters the I/Oe and is output from I/Oc, the anode of D is directly connected to E and the port I/Oe, and the cathode of D is directly connected to C and the port I/Oc. It is important to note that the operational amplifier shown in FIG. 4 is used as an output driving interface. The driving interface is used as a current or voltage output driving interface, and a magnitude of a maximum current allowed to be output is determined by the second diode D.

According to an embodiment of the present disclosure, a driving interface is further provided. The driving interface is a current or voltage driving interface, and the driving interface includes an operational amplifier shown in FIG. 2 to FIG. 4. And, when the operational amplifier shown in FIG. 4 is used as the current or voltage output driving interface, a first port and fourth port of the operational amplifier are suspended. And a driving current or a driving voltage flows into a second port of the operational amplifier, and flows out of a third port in the operational amplifier through a second diode in the operational amplifier. The third port of the operational amplifier is connected with a driven object.

When the operational amplifier shown in FIG. 4 is used as a high current driving interface, Vdj and GND are suspended. The driving current flows into the port I/Oe, flows out of the port I/Oc after passing through the diode D, and then is injected into a current input port of the driven object. A maximum value of the driving current is consistent with a maximum working current of the diode D.

When the operational amplifier shown in FIG. 4 is used as the voltage driving interface, the driving voltage is directly loaded to the port I/Oe. A high level output of the operational amplifier is transmitted to the port I/Oc after passing through the diode D, a low level output of the operational amplifier is transmitted to the port I/Oc after passing through the triode. And then the driving voltage is loaded to a driving voltage input port of the driven object. A maximum output voltage drop of the driving voltage which passes through an operational amplifier circuit shown in FIG. 4 is consistent with a maximum working voltage drop of the diode D. And a minimum output voltage is higher than a minimum voltage loaded to the port I/Oe by a saturated voltage value, i.e. 0.3V, of a transistor. When voltage loss of the high level output is required to be reduced, a diode D with a small forward voltage drop is adopted.

It is important to note that when the operational amplifier shown in FIG. 4 is used as the voltage driving interface, if the port Vdj is set in a suspended state and the fourth port GND is in a grounding state, the maximum driving voltage is determined by maximum allowable power consumption of Re. For avoiding influence of a driving voltage applied to I/Oe of a certain element on other elements, a difference between the voltage and Vdj does usually not reach or exceed Vebo of the triode Q, and Vebo is a maximum backward voltage value loaded between the base B and the emitter E when the collector C of the triode Q is suspended. However, during a practical application, as long as the voltage transmitted through Rb does not damage other circuit components directly or indirectly connected to the port Vdj or influence normal works of other circuit components, the maximum value of the driving voltage is not limited by a condition of Vebo.

It is important to note that if a difference between the voltage applied to I/Oe and Vdj reaches or exceeds a Vebo value of the triode Q but is within an allowable range of maximum power consumption of Re, a diode is connected in series between Vdj and the base B of the triode Q, such as Db in FIG. 2 and FIG. 3.

The operational amplifier shown in FIG. 1 to FIG. 4 is also used as a chopped wave input interface. According to a principle of a current amplifier, a current Ic flowing into the collector C of Q and a magnitude IB of a current flowing into the base B of Q form the following relationship:

$$Ic = \beta * Ib \quad (333.1).$$

β in the formula (333.1) is a current amplification coefficient of Q, for the same triode Q or current amplifier Ia, β is a constant value, and for different triodes Q or current amplifiers Ia, β is a different value. From the formula (333.1), it can be seen that the magnitude of the current Ib flowing into the base B of Q through the resistor Rb is regulated to determine a magnitude of the current Ic flowing into the collector C of Q through the port I/Oc. According to the Ohm law:

$$I = V/R \quad (333.2).$$

It can be seen that an output voltage obtained from I/Oe is: Ve=(Ic+Ib)*Re, i.e.

$$Ve = (\beta+1) * Ib * Re \quad (333.3).$$

From the formula (333.3), it can be seen that under the condition that a value of a voltage Vc applied to the port I/Oc is not smaller than a minimum linear working voltage of Q or Ia when the resistor Re is constant. In other words, under the condition that the formula (333.1) is ensured to be true, an obtained practical magnitude Ve of the port I/Oe is related to Ib after transmission to the port I/Oe. That is, the magnitude of the voltage Ve is unrelated to the voltage value Vc applied to the port I/Oc as long as the magnitude of Ib does not change in the working process, so that a purpose of chopping is achieved.

It is important to note that when the operational amplifier shown in FIG. 1 to FIG. 4 is used as the chopped wave input interface, the maximum voltage Vc loaded to the port I/Oc is determined by a minimum value between Vcbo of Q (Vcbo is a maximum value loaded between the base B and the collector C when E is suspended) and a backward withstanding voltage Vd of D.

According to an embodiment of the present disclosure, a sensor is further provided. The sensor is applied to detection of a signal level state in a wide voltage fluctuation range. The sensor of the embodiment includes any operational amplifier shown in FIG. 1 to FIG. 4. A detected signal source is connected with a third port I/Oc, a detection signal is output from a second port I/Oe, and a magnitude of a current shunted from the detected signal source for a transistor is controlled by adjusting a second resistor Re or a first resistor Rb.

When any operational amplifier shown in FIG. 1 to FIG. 4 is applied to measurement of a level state signal of an object, a chopping function of the operational amplifier is utilized for implementation. According to requirements of a measurement and control technology and a corresponding standard, any measurement instrument including the sensor cannot generate any obvious influence on a real-time state value of the measured object during practical measurement work. That is, any obvious change in mechanical, thermal, acoustic, optical and electrical "physical variables" and the like of a measured point and a constitutive substance, i.e. a "chemical variable", during measurement work is not allowed.

According to the abovementioned measurement requirement, when a level state of a measurement target point changes, input impedance of the measurement instrument including the sensor is required to be as high as possible. That is, a magnitude of a current shunted from the measured point or a generated voltage drop is required to be as small as possible. Therefore, when states of high level signals which are or practically have conducted interference signals are measured, those skilled in the art think of photocouplers at first. According to a working principle and technical manual of a photocoupler, it can be known that a current of about 5 mA and even higher is required to pass through the photocoupler to reliably detect the signal state. That is, the current of about 5 mA and even higher is usually required to be shunted from the measured point when a voltage change of the measured point is measured by a parallel method, which is unfavorable for a high-resistance signal source or a target component working with a low current. It is also difficult to measure that the current flowing through the measured point is higher than a maximum working current allowed to enter the photocoupler by a series method.

That is, a normal working state of a measured relay is influenced when whether a working voltage is loaded to a coil of the relay with a low working current of which a holding current does not reach 20 mA and a high working voltage or not is detected by the parallel method with the photocoupler. Normal working states of the photocoupler and the measured relay are also influenced when whether a working current is loaded to the coil of the relay of which the working current is higher than 30 mA or not is detected in series with the photocoupler. And for a direct current relay of which a working voltage is not higher than 6V, it is impossible to detect whether it is in a normal working state or not by a method of connecting the photocoupler in series.

According to the principle that the operational amplifier shown in FIG. 1 to FIG. 4 has the chopping function, after the voltage loaded to Vdj is known, the value of Rb or Re is adjusted to ensure that the requirement can still be met when the current flowing into I/Oc is not high and even lower than 1 mA, thereby achieving a measurement scenario where no photocoupler is suitable to be used but high voltage or conducted interference isolation is required.

According to an embodiment of the present disclosure, measurement and control device is further provided. The measurement and control device includes at least one measurement and control interface, and the measurement and control interface may include any operational amplifier shown in FIG. 1 to FIG. 4.

From the above, it can be seen that the operational amplifier circuit in the embodiment of the present disclosure has a directionless control selection circuit, supports an input or output operation anytime, is freely changed for input or output even though a Printed Circuit Board (PCB) has been manufactured and shaped and even surface-mounted and welded or mounted in field device, and thus seems more active and favorable than an interface device on the current market for supporting of an intelligent measurement and control product. Therefore, an operation that a certain port is used as input if being required to be used as input and a certain port is used as output if being required to be used as output is implemented anytime. And the intelligent product is more intelligent.

Figure 5:
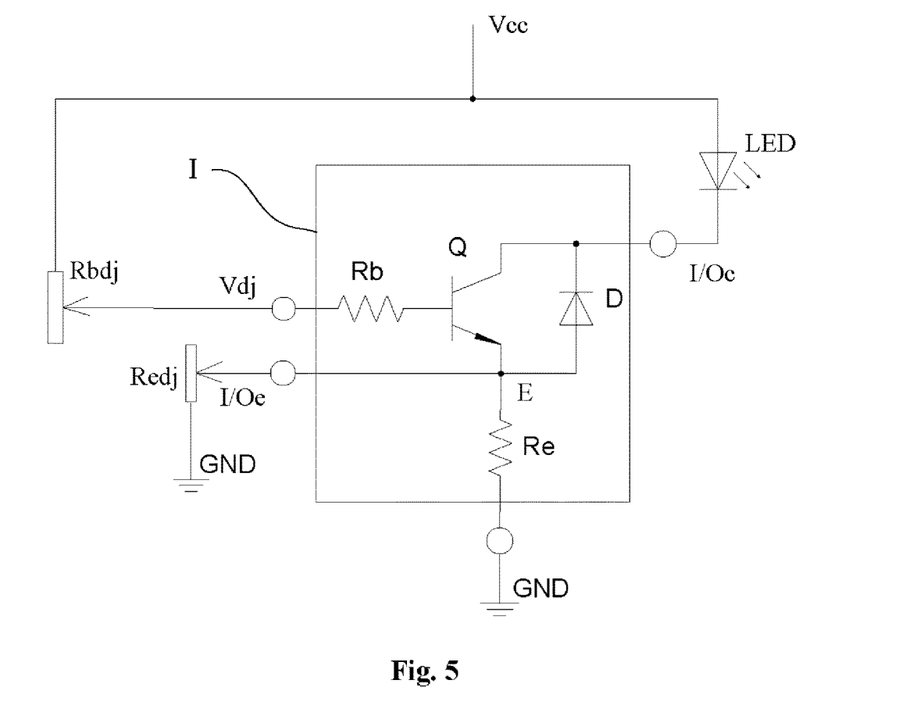
FIG. 5 is a structural schematic diagram of an LED driving circuit according to one embodiment of the present disclosure.
Figure 6:
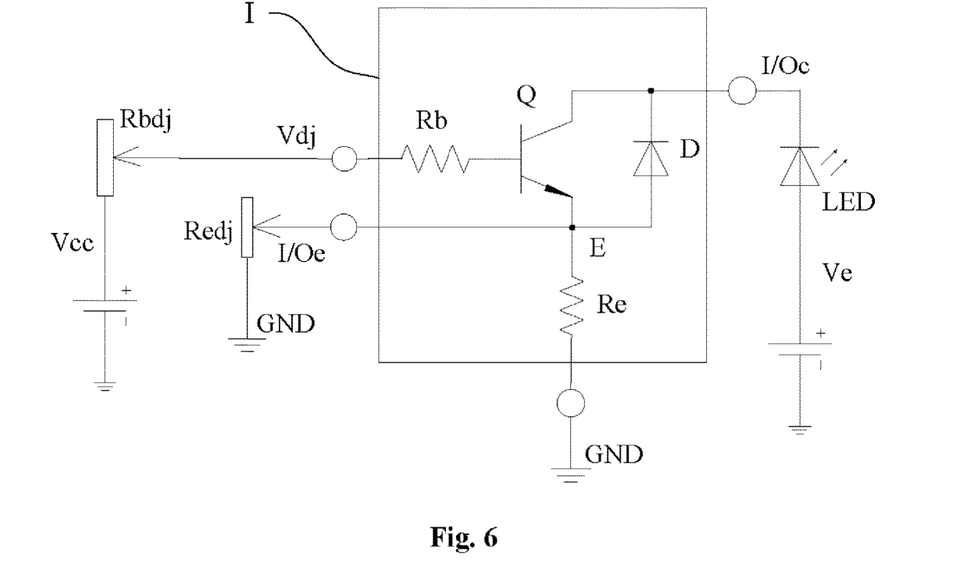
FIG. 6 is a structural schematic diagram of an LED driving circuit according to another embodiment of the present disclosure.

According to an embodiment of the present disclosure, a driving circuit is further provided. The driving circuit is used as an input driving circuit, and the driving circuit may be arranged to drive an object working at a constant current, such as an LED. The driving circuit may include any operational amplifier shown in FIG. 1 to FIG. 4. FIG. 5 is a structural schematic diagram of an LED driving circuit according to an embodiment of the present disclosure. As shown in FIG. 5, the driving circuit includes: any operational amplifier I shown in FIG. 1 to FIG. 4; a first resistance voltage divider Rbdj, of which an adjustable end is connected with a first port Vdj in the operational amplifier and the other end is connected with a power supply Vcc. An anode end of the driven LED is connected with the power supply Vcc or a power supply common-grounded with a fourth port, such as Ve shown in FIG. 6, and the other end is connected with a third port I/Oc in the operational amplifier. A second resistance voltage divider Redj, of which an adjustable end is connected with a second port I/Oe in the operational amplifier and the other end is grounded. The first resistance voltage divider Rbdj and Rb are combined with the second resistance voltage divider Redj and Re to determine a magnitude of a driving current flowing through the driven object together.

The LED is a positive temperature coefficient device, and is required to be driven by a circuit with a current limiting function when working to ensure that a maximum current flowing through the LED will never exceed an allowed maximum working current value. According to the above, it can be seen that the operational amplifier circuit in the embodiment of the present disclosure meets a basic requirement of an LED driving circuit, and can be arranged to drive some common LEDs, as shown in FIG. 5.

In FIG. 5, a method for adjusting a working current of the LED (i.e. the current flowing through the LED) includes one of the following two methods or both the following two methods.

First, when a resistance value of an emitter E of a triode Q, i.e. the port I/Oe, to the GND is fixed, a magnitude value of a voltage loaded to the port Vdj is adjusted to adjust a magnitude value of the working current of the LED. In FIG. 5, a component providing an adjustable voltage value for Vdj is a resistance voltage divider, i.e. a variable resistor. If a voltage value divided from the resistor voltage divider is higher, the working current flowing through the LED is higher. On the contrary, if the voltage value divided from the resistance voltage divider is lower, the working current flowing through the LED is lower. A specific divided voltage value is determined by a working current value practically required when the LED works.

Second, when the voltage value loaded to Vdj is fixed, a magnitude of resistance of the resistor Redj connected in parallel with the port I/Oe is adjusted to correspondingly change the magnitude of the current flowing through the LED. If the resistance of Redj in FIG. 5 is decreased, the working current flowing through the LED is increased. On the contrary, if the resistance of Redj in FIG. 5 is increased, the working current flowing through the LED is decreased. A specific value of the resistor Redj is determined by the working current value practically required when the LED works.

It is important to note that the LED in FIG. 5 is a driven LED and Rbdj and Redj are both variable resistors and are arranged to adjust luminance of the LED. During a practical application, the variable resistors Rbdj and Redj are simultaneously used, and any one of the variable resistors Rbdj and Redj are also independently used. If the luminance is not required to be adjusted, the variable resistors Rbdj and Redj are fixed to a certain proper values according to required luminance, and value ranges of the proper values are: Redj>0. That is, I/Oe is not allowed to be short-circuited to the GND, and Rbdj<∞, that is, Vdj is not broken to Vcc.

Figure 7:
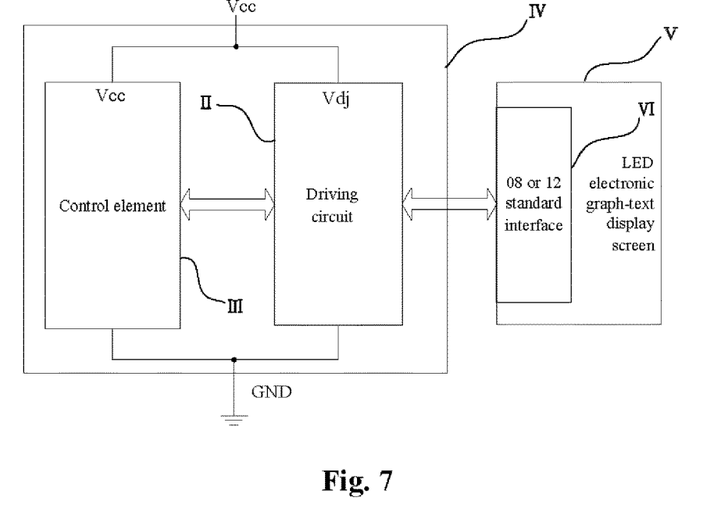
FIG. 7 is a structural schematic diagram of a driver of an electronic graph-text display screen according to an embodiment of the present disclosure.

According to an embodiment of the present disclosure, a driver is further provided. The driver is used as an information driver, and the driver is arranged to drive an electronic graph-text display screen. And the electronic graph-text display screen includes at least one driving signal input interface. FIG. 7 is a structural schematic diagram of a driver of an electronic graph-text display screen diver according to an embodiment of the present disclosure. As shown in FIG. 7, the LED electronic graph-text display screen V includes at least one driving signal input interface. VI is the driving signal input interface of the LED electronic graph-text display screen, such as a 08 or 12 standard interface shown in FIG. 7, and according to different interface definitions, leads are modified for sequencing. The driver IV of the electronic graph-text display screen includes: a driving circuit II, connected with the at least one driving signal input interface; a control element III, connected with the driving circuit II and arranged to control a driving process of the driving circuit II over the electronic graph-text display screen and a power supply Vcc, respectively connected with the driving circuit II and the control element III.

The driving circuit II includes at least one operational amplifier shown in FIG. 1 to FIG. 4 and the at least one operational amplifier shown in FIG. 1 to FIG. 4 forms an array structured integrated circuit. The control element III is a CPU, and is also an MCU.

Figure 8:
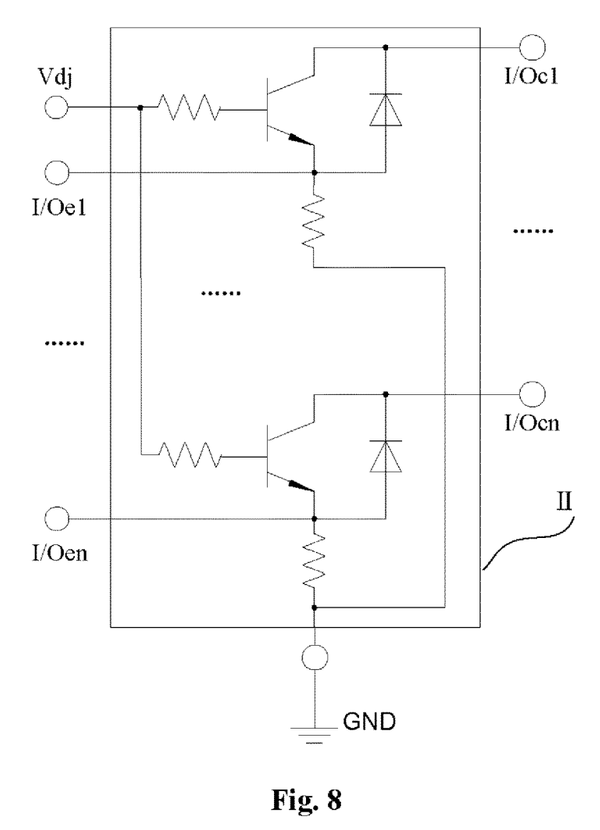
FIG. 8 is a structural schematic diagram of an array driving circuit according to an embodiment of the present disclosure.

Optionally, the array structured driving circuit II is arranged to drive LED electronic graph-text display screens with multiple standard interfaces. FIG. 8 is a structural schematic diagram of an array driving circuit according to an embodiment of the present disclosure. As shown in FIG. 8, the driving circuit II includes: a power port, connected with the power supply; at least one emitter port, respectively connected with the control element III; at least one collector port, respectively connected with the at least one driving signal input interface; and a grounding port, which is a common port, i.e. a GND port, of a fourth port in the at least one operational amplifier.

And the power port is a common port of a first port, i.e. a port Vdj, of the at least one operational amplifier, and a current in-phase input port or voltage inverted input port of the operational amplifier corresponds to a base port of a transistor. A current inverted input port or voltage in-phase input port of each operational amplifier corresponds to the emitter port of a transistor, i.e. I/Oe1, I/Oe2, . . . , I/Oen. And an output port of each operational amplifier corresponds to a collector port, i.e. I/Oc1, I/Oc2, . . . , I/Ocn. Vdj ports of each basic element in the driving circuit II are all connected to the same Vdj port, GND ports of each basic element are also all connected to the same GND port, I/Oe and I/Oc of each element are independently led out respectively to form I/Oe1, I/Oe2, . . . , I/Oen and corresponding I/Oc1, I/Oc2, . . . , I/Ocn of the array structured integrated circuit, and here, a number of the elements is n=2, 3, . . . , 32.

According to an embodiment of the present disclosure, a detection device is further provided. The detection device is arranged to detect an on/off state of a switch. The detection device includes any operational amplifier shown in FIG. 1 to FIG. 4, and a third port of the operational amplifier is used as a signal input port. The detection device further includes: the switch used as a detected object, of which one end is connected with a collector of a transistor of the operational amplifier through the signal input port and the other end is grounded; and a current limiting resistor, arranged to convert the on/off state of the switch into a low/high state of a level signal, and the third port of the operational amplifier is connected with a power supply of the detection device or a power supply common-grounded with a fourth port through the current limiting resistor.

Figure 9:
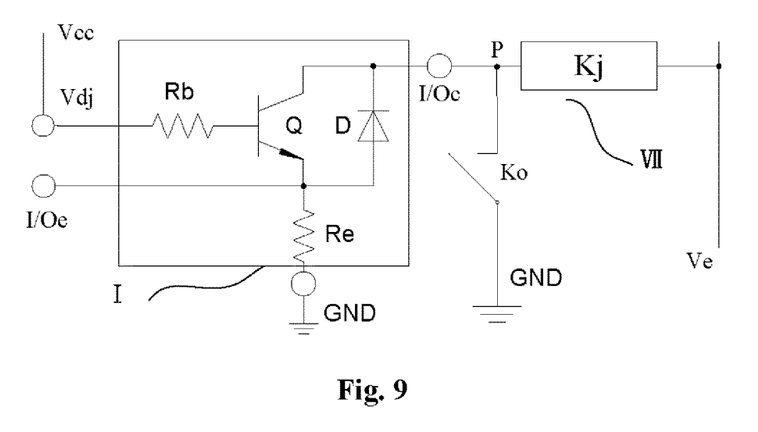
FIG. 9 is a structural schematic diagram of a detection device for a state of a horn switch of an automobile according to an embodiment of the present disclosure.

For example, an on/off state of a horn switch of an automobile is detected by virtue of the detection device in the embodiment of the present disclosure. FIG. 9 is a structural schematic diagram of a detection device for an on/off state of a horn switch of an automobile according to an embodiment of the present disclosure. As shown in FIG. 9, the detection device includes any operational amplifier I shown in FIG. 1 to FIG. 4. The detection device further includes: a relay Kj, of which one end is connected with a power supply Ve of the automobile and the other end is connected with a measured point P of the detected horn switch Ko, and it is important to note that the relay Kj also has a function of a current limiting resistor, and is mainly arranged to convert the on/off state of the horn switch of the automobile into a low/high state of a level signal; and the detected horn switch Ko, the end where the measured point P of the detected horn switch Ko is located being connected with a third port I/Oc in the operational amplifier and the relay Kj respectively and the other end being grounded, and a first port Vdj of the operational amplifier is connected with a power supply Vcc of the detection device.

Figure 10:
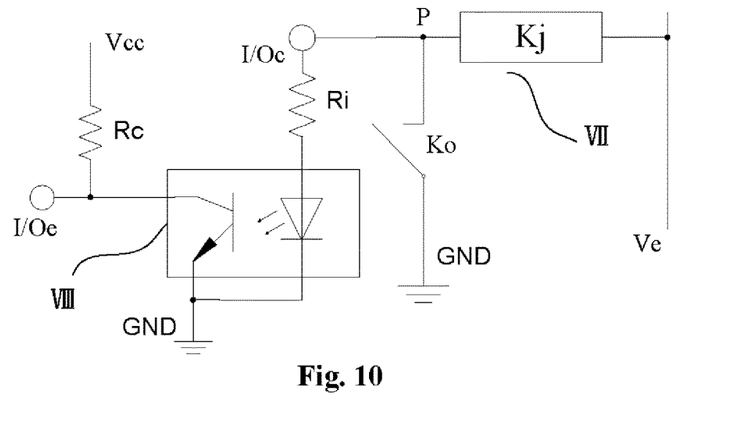
FIG. 10 is a structural schematic diagram of a detection device for a state of a horn switch of an automobile according to the related art.
Figure 11:
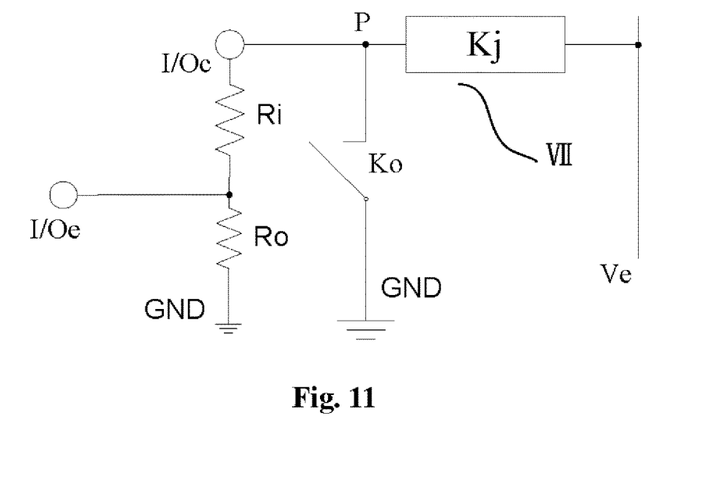
FIG. 11 is a structural schematic diagram of another detection device for a state of a horn switch of an automobile according to the related art.

FIG. 10 is a structural schematic diagram of a detection device for a state of a horn switch of an automobile according to the related art. FIG. 11 is a structural schematic diagram of another detection device for a state of a horn switch of an automobile according to the related art. By comparing FIG. 10 and FIG. 11 with FIG. 9, it can be seen that the detection device for the state of the horn switch of the automobile in the embodiment of the present disclosure is automatically adapted to testing vehicles with 12V and 24V power supply systems, specifically as follows.

VII in FIG. 9 to FIG. 11 is the relay Kj of which a release current is lower than 10 mA but an attracting current is higher than 20 mA and which is arranged to control a horn of the automobile. KO is a control switch mounted on a steering wheel, and the horn of the automobile blares when the control switch Ko on the steering wheel is pressed. P is a detection sampling point, when Ko is switched on, a level of P is 0,and when Ko is switched off, if there is no sampling sensor connected, the level of P is equal to a voltage Ve of a power supply system of the automobile. If whether a driver blare the horn or not is detected by a method of detecting whether the switch Ko is switched on or not.

As shown in FIG. 10, VIII is a photocoupler forming a sensor acquiring the state of Ko, Rc is a pull-up resistor of an output end I/Oe of the photocoupler VIII and Ri is a current limiting resistor of an input end I/Oc of the photocoupler VIII. When the corresponding detection sensor is manufactured by virtue of the photocoupler VIII in FIG. 10, a current of about 5 mA is required to flow through the relay VII of the horn to enter a sampling port I/Oc of the sensor. And when the release current of the relay VII of the horn is lower than 10 mA, the sensor designed for the power supply system with Ve=12V cannot be used for the power supply system with Ve=24V. Otherwise there exists such a probability that the relay VII cannot be released and the horn blares for long after the horn is blared. On the contrary, if the sensor designed for the power supply system with Ve=24V is used for the power supply system with Ve=12V, the current flowing through the relay VII of the horn and entering the photocoupler VIII through the sampling port I/Oc is lower than 3 mA. And whether the on/off state of the switch Ko for blaring the horn changes or not cannot be detected.

As shown in FIG. 11, Ri and Ro are two voltage division resistors forming a voltage division type sensor. One end of Ri is directly connected to the detection sampling point P through I/Oc, and the other end is connected with Ro. One end of Ro is directly connected to a common grounding end GND, an output signal is a voltage of Ro to the GND, and the output signal is output from I/Oe directly connected to a connecting point of Ri and Ro. When the corresponding detection sensor is manufactured by a method of voltage division with the resistors shown in FIG. 11, although there is no probability that the relay VII cannot be released and the horn blares for long after the horn is blared, when the sensor designed for the power supply system with Ve=12 is used for the power supply system with Ve=24V, the voltage output from the sampling output port I/Oe is increased to be 200%, and then a detection signal may cause damage to a corresponding post-stage analysis circuit. On the contrary, if the sensor designed for the power supply system with Ve=24V is used for the power supply system with Ve=12V, the voltage output from the sampling output port I/Oe is decreased to be 50%, which makes at least one detection signal impossible to detect whether the on/off state of the switch Ko for blaring the horn changes or not.

As shown in FIG. 9, a corresponding detection sensor is manufactured by virtue of the operational amplifier circuit of the embodiment of the present disclosure. And because the detection sensor is constant-current and the current absorbed from the sampling port I/Oc is as low as below 1 mA, the same sampling hardware circuit reliably detects the on/off state of Ko without bad influence on preceding-stage and post-stage circuits no matter whether the sampling hardware circuit is used for the power supply with Ve=12V or Ve=24V.

The embodiments of the present disclosure achieve the following technical effects.

One, the circuit of the embodiments of the present disclosure is a bidirectional interface circuit which does not require direction selection control and is also adapted to input and output. The bidirectional interface circuit includes few circuit components, and is simple in structure and easy to integrally manufacture, a component production process and application technology are mature, and a product is convenient to popularize and use, and has great market potential.

Two, when the circuit of the embodiments of the present disclosure is used for manufacturing or transforming a board card which has been widely applied to the field of measurement and control, the board card has more uses than that manufactured by taking another component as an interface circuit. A direction between input and output is changed more flexibly, and product research and development and practical application are both facilitated.

Three, because of no requirement on direction selection control, when the circuit of the embodiments of the present disclosure is used as an interface device, port pin resources of a CPU or an MCU are saved. Software overhead and a board card area of a PCB are also reduced, and a research and development period, production cost and maintenance cost of the whole application system are reduced. Particularly when some input or output ports are insufficient but some other output or input in the same system has sufficient redundancy, or when positions of some input or output ports are required to be adjusted, using the circuit of the embodiments of the present disclosure can prevent a corresponding application board card from being remanufactured, and is required to redefine a mapping relationship between a software port and a hardware port.

Four, when the circuit of the embodiments of the present disclosure is used as an input interface, since the sampling current can be adjusted to be lower than 1 mA and even lower than an mA level, during application to sampling of a high-voltage high-impedance signal with conducted interference noise, for a photoelectric coupling input port required to shunt a current of at least about 5 mA from a sampling point, influence on the signal source is obviously reduced.

Five, when the circuit of the embodiments of the present disclosure is used as an input and output port of an intelligent product, since there is no direction selection requirement, the circuit is freely used for input or output, the product seems higher in "intelligence", and the software and hardware overhead is lower.

Six, the circuit of the embodiments of the present disclosure is automatically adapted to requirements of multiple input and output interface circuits, and reduces research and development and warehousing and management cost of a production element, and researchers and developers intensively study performance, parameters and application technologies of fewer interface circuits, thereby shortening the period.

Seven, the circuit of the embodiments of the present disclosure dynamically or statically drives an LED device, so that the interface circuit is applied to the field of human-computer interfaces, and products designed by the researchers and developers are more flexible in application and more powerful in function.

Eight, during application to a driver skill testing system, the same hardware is respectively applied to acquisition of various signals required by driving testing on vehicles and driving of LED electronic graph-text information screens on roofs of the testing vehicles by the array interface circuit of the embodiments of the present disclosure through corresponding software.

Nine, when being applied to the driver skill testing system, the circuit of the embodiments of the present disclosure is automatically adapted to testing vehicles with 12V and 24V power supply systems, and an adaptive function is not necessary when a resistor current limiting or voltage division sampling method is adopted.

Ten, when a state signal detection sensor is manufactured by virtue of the circuit of the embodiments of the present disclosure, because the state signal detection sensor has the chopping function, the conducted interference noise is greatly attenuated, which is far better than a photocoupler. Because the state signal detection sensor has the current limiting function, the output voltage obtained from the output port I/Oe is constant, and for a voltage signal of which a detection voltage does not exceed a maximum value allowed by I/Oc, a voltage isolation function is approximate to the photocoupler, but shunting influence is far better than the photocoupler.

Eleven, when the circuit of the embodiments of the present disclosure is applied to manufacturing of an input and output interface of an MCU or a CPU, a bearable input level value is far higher than a working voltage of the circuit, so that a peripheral circuit structure of the application system is greatly simplified.

Sequence numbers of the embodiments of the present disclosure are adopted for description, and do not represent quality of the embodiments.

In the embodiments of the present disclosure, each embodiment is described with different focuses, and parts which are not elaborated in a certain embodiment refer to related descriptions of the other embodiments. In some embodiments provided by the present disclosure, it should be understood that the disclosed technical content may be implemented in another manner.

The above are exemplary implementation modes of the embodiments of the present disclosure. It should be pointed out that those skilled in the art further make a plurality of improvements and embellishments without departing from the scope protection as claimed in claims of the present disclosure, and these improvements and embellishments shall also fall within the scope of protection of the embodiments of the present disclosure.

What is claimed is:

1. An operational amplifier, comprising a transistor, wherein the operational amplifier is used as at least one of an input interface and output interface, and when the operational amplifier corresponds to one transistor, an external circuit of the transistor further comprises:
  a first port, connected with a base of the transistor through a first resistor;
  a second port, connected with an emitter of the transistor;
  a third port, connected with a collector of the transistor; and
  a fourth port, connected with the emitter of the transistor through a second resistor and used as a public port for signal input and signal output;
  wherein further comprising: a first diode, connected in series with the first resistor;
  wherein an anode of the first diode is connected with the first resistor and a cathode of the first diode is connected with the base of the transistor, or an anode of the first diode is connected with the first port and the cathode of the first diode is connected with the first resistor.

2. The operational amplifier as claimed in claim 1, wherein further comprising:
   a second diode, of which an anode is connected with the emitter of the transistor and a cathode is connected with the third port.

* * * * *